United States Patent
Nobutaka et al.

(10) Patent No.: US 7,602,059 B2
(45) Date of Patent: Oct. 13, 2009

(54) LEAD PIN, CIRCUIT, SEMICONDUCTOR DEVICE, AND METHOD OF FORMING LEAD PIN

(75) Inventors: Yasushi Nobutaka, Osaka (JP); Hiroshi Kamiya, Osaka (JP)

(73) Assignee: NEC Systems Technologies, Ltd., Osaka-shi, Osaka (JP)

( * ) Notice: Subject to any disclaimer, the term of this patent is extended or adjusted under 35 U.S.C. 154(b) by 0 days.

(21) Appl. No.: 11/485,393

(22) Filed: Jul. 13, 2006

(65) Prior Publication Data

US 2007/0085191 A1    Apr. 19, 2007

(30) Foreign Application Priority Data

Oct. 18, 2005    (JP) .............. 2005-303383

(51) Int. Cl.
*H01L 23/49* (2006.01)
*H01L 23/498* (2006.01)

(52) U.S. Cl. .............. 257/697; 257/775; 257/E23.024; 257/E23.067

(58) Field of Classification Search .......... 257/697, 257/775, E23.024, E23.067
See application file for complete search history.

(56) References Cited

U.S. PATENT DOCUMENTS

| | | | |
|---|---|---|---|
| 5,743,004 A * | 4/1998 | Chobot et al. .............. 29/830 |
| 6,338,208 B1 * | 1/2002 | Waterbury .................. 36/134 |
| 6,388,198 B1 * | 5/2002 | Bertin et al. ................ 174/251 |
| 6,943,452 B2 * | 9/2005 | Bertin et al. ................ 257/774 |
| 2006/0152299 A1 | 7/2006 | Lee et al. | |
| 2006/0189176 A1 * | 8/2006 | Li .............................. 439/66 |

FOREIGN PATENT DOCUMENTS

| | | | | |
|---|---|---|---|---|
| JP | 54-107888 | 8/1979 | | |
| JP | 58-15262 | 1/1983 | | |
| JP | 63-147834 | 6/1988 | | |
| JP | 3-257853 | 11/1991 | | |
| JP | 03-3257853 | * 11/1991 | ......... 23/50 |
| JP | 5-299132 | 11/1993 | | |
| JP | 5-335472 | 12/1993 | | |
| JP | 7-66353 | 3/1995 | | |
| JP | 9-167528 | 6/1997 | | |
| JP | 2000-261121 | 9/2000 | | |
| JP | 2003-31751 | 1/2003 | | |
| TW | I252065 B | 3/2006 | | |

OTHER PUBLICATIONS

Japanese Office Action dated May 20, 2008 with a partial-English translation.
Chinese Office Action dated Feb. 1, 2008 with English translation.
Chinese Office Action dated Jan. 16, 2009 with English-Language Translation.
Taiwanese Office Action dated Feb. 27, 2009 with English-Language Translation.

* cited by examiner

*Primary Examiner*—Victor A Mandala
(74) *Attorney, Agent, or Firm*—McGinn IP Law Group, PLLC

(57) ABSTRACT

A lead pin of a circuit includes a pin, an insulator that surrounds the pin, and a conductor that surrounds the insulator, the conductor including non-uniformity.

20 Claims, 3 Drawing Sheets

LEAD PIN, CIRCUIT, SEMICONDUCTOR DEVICE, AND METHOD OF FORMING LEAD PIN

BACKGROUND OF THE INVENTION

The present invention relates to a semiconductor device and more particularly to the structure of a pin of a circuit and a semiconductor device and a method of forming a lead pin.

A signal frequency handled by a circuit (e.g., an LSI (Large Scale Integration)) is rising each year with development of digital technologies, and a circuit (e.g., an LSI) that handles a signal whose frequency exceeds a gigahertz is known. A serial-transfer interface or the PCI (Peripheral Component Interconnect) Express, for instance, connects between circuits (e.g., LSIs) at 2.5 Gbps (maximum frequency: 1.25 GHz). Because of reduction (attenuation) of a signal whose frequency is higher than 1.0 gigahertz and instability of a waveform caused by reflection, signal transmission on a printed-circuit board becomes difficult.

Because a connection portion of a circuit (e.g., an LSI) and a printed-circuit board is open, characteristic impedance matching may be difficult. It is expected that a signal whose frequency exceeds 10 GHz will be transmitted in the future, and thus characteristic impedance matching becomes more important.

A circuit pin (e.g., an LSI lead pin) has some problems with high-frequency signal transmission. In other words, a circuit pin (e.g., an LSI lead pin) may have a mismatch characteristic impedance when used as a signal transmission line. This results from the fact that the circuit pin (e.g., the LSI lead pin) may not have a stable reference (GND) required for characteristic impedance matching.

When different transmission lines are connected such as, for example, a connection of the LSI and the printed-circuit board, an LSI and a printed-circuit board may not be connected while a constant characteristic impedance is maintained because of physical limitations on a location, difference in pattern width, and the like.

As an example of a pin with a coaxial structure that has a central conductor, an insulator, and an outer conductor in view of impedance matching, JP-A No. 2000-261121 discloses a pin grid array (PGA) type electronic part that has an annular coaxial electrode coaxially with a pin electrode via an insulating member at the pin electrode. JP-A No. 66353/1995 discloses a semiconductor device in which an external terminal of a multilayer wiring board (package board) mounting a semiconductor chip is formed with an electrically-conducting path coaxially via an insulator between a signal line and a power line and the thickness of an insulating layer is adjusted so that the impedance of the external terminal conforms to the characteristic impedance of a printed-circuit board.

SUMMARY OF THE INVENTION

In view of the foregoing and other exemplary problems, drawbacks, and disadvantages of the conventional techniques, it is an exemplary feature of the present invention to provide a lead pin, a circuit, a semiconductor device, and a method of forming a lead pin that may adjust matching a characteristic impedance with the characteristic impedance of a printed-circuit board.

The present invention provides a lead pin of a circuit, including a pin, an insulator that surrounds the pin, and a conductor that surrounds the insulator, the conductor including non-uniformity.

The present invention also provides a circuit, including the lead pin above.

The present invention also provides a semiconductor device, including the circuit above, and a printed-circuit board, the circuit being connectable to the printed-circuit board through the lead pin.

The present invention also provides a method of forming a lead pin, including surrounding a pin with an insulator, and surrounding the insulator with a conductor that includes non-uniformity.

[Exemplary advantage of the Invention]

According to an exemplary embodiment of the invention, the characteristic impedance matching in a signal transmission path may be enabled, because a lead pin of a circuit includes a pin, an insulator that surrounds the pin, and a conductor that surrounds the insulator, with the conductor having a non-uniformity.

BRIEF DESCRIPTION OF THE DRAWINGS

The novel and exemplary features believed characteristic of the invention are set forth in the appended claims. The invention itself, however, as well as other exemplary features and advantages thereof, will be best understood by reference to the detailed description which follows, read in conjunction with the accompanying drawings, wherein:

DETAILED DESCRIPTION OF THE EXEMPLARY EMBODIMENTS

Figure 1:
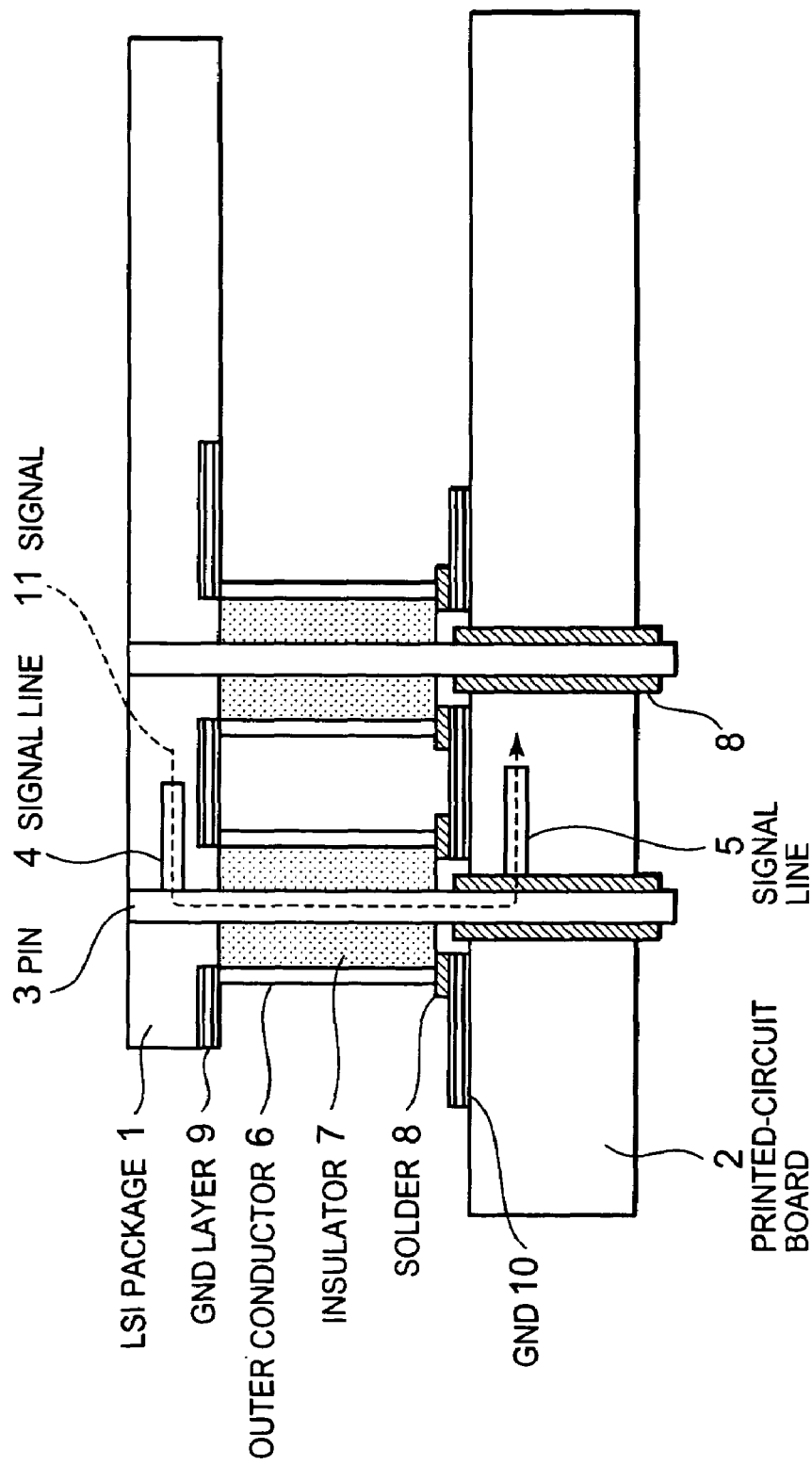
FIG. 1 shows an exemplary cross-sectional view of a circuit (e.g., LSI 1), pin 3 and printed-circuit board 2 that shows an exemplary configuration according to an exemplary embodiment of the present invention.

The present invention will be described in more detail with reference to the attached drawings. In an exemplary embodiment of the present invention, a circuit lead pin (e.g., LSI lead pin 3) is concentrically surrounded by an insulator (also called a coaxial insulator) 7 and an outer conductor 6, an impedance of a transmission line including a lead pin 3 and an Outer conductor 6 is matched with an impedance of a signal line of a circuit lead pin (e.g., LSI lead pin 3). In an exemplary embodiment of the present invention, the outer conductor 6 includes a gap 12 in at least part of arcs of its circumferential section.

The prevention of impedance mismatch that inhibits transmission of a high-frequency signal may reduce reflection caused by impedance mismatch that occurs at the place of a circuit lead pin (e.g., an LSI lead pin 3). As is well known, reflection due to mismatch between a load impedance $Z_L$ and a signal transmission line impedance $Z_O$ is given by $\Gamma=(Z_L-Z_O)/(Z_L+Z_O)$, for example.

According to an exemplary embodiment of the present invention, pin impedance can be made variable by changing a type of insulator 7 between lead pin 3 and an outer conductor 6. The impedance may be changed by changing the thickness of the insulator 7, the distance between lead pin 3 and outer conductor 6, and/or size of gap 12.

According to an exemplary embodiment of the present invention, a circuit pin (e.g., an LSI lead pin) includes a configuration that may minimize loss of a signal passing through the circuit (e.g., the LSI lead pin) by providing an insulator and a non-uniform outer conductor and optimizing a characteristic impedance. According to an exemplary embodiment of the invention, a circuit lead pin (e.g., an LSI lead pin) may be formed with a coaxial structure to adjust the characteristic impedance of a signal of a circuit (e.g., an LSI package) to that of a signal on a printed-circuit board, and thereby enabling the characteristic impedance matching in a signal transmission path.

When all impedances are matched, a signal is not reflected in a discontinuous portion of a characteristic impedance, thus allowing conduction of a waveform with little waveform distortion. The present invention is discussed below according to an exemplary embodiment.

FIG. 1 illustrates the configuration of a circuit lead pin (e.g., an LSI lead pin) according to an exemplary embodiment of the present invention. A circuit (e.g., LSI package) 1 is mounted on printed-circuit board (printed wiring board) 2. Pin 3 has been connected to signal line 4 in a circuit (e.g., LSI package 1) (package board). The pin is inserted into a through hole of printed-circuit board 2 when the circuit (e.g., the LSI package) is mounted on printed-circuit board 2, and the pin is electrically connected to signal line 5 of a signal layer in printed-circuit board 2.

The circuit lead pin (e.g., the LSI lead pin) includes insulator 7 that surrounds pin 3, may include a hollow cylindrical shape, and has outer conductor 6 that covers insulator 7. An end of outer conductor 6 at a circuit (e.g., LSI package 1) may be connected to GND layer 9 on the board facing surface of the circuit (e.g., LSI package 1), and an end of outer conductor 6 at printed-circuit board 2 may be connected to GND 10 with solder 8 when the LSI package is mounted. Signal 11 in a circuit (e.g., LSI package 1) is transmitted through signal line 4, pin 3, and signal line 5. For example, a characteristic impedance of signal line 4 in circuit (e.g., LSI package 1) and signal line 5 in printed-circuit board 2 is specified as 50Ω.

Figure 2A:
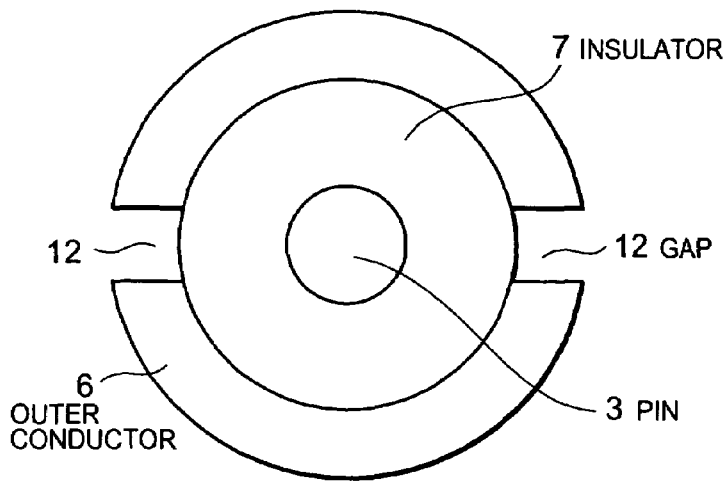
FIGS. 2A-2C show exemplary radial cross-sectional views of pin 3 according to an exemplary embodiment of the present invention.
Figure 2B:
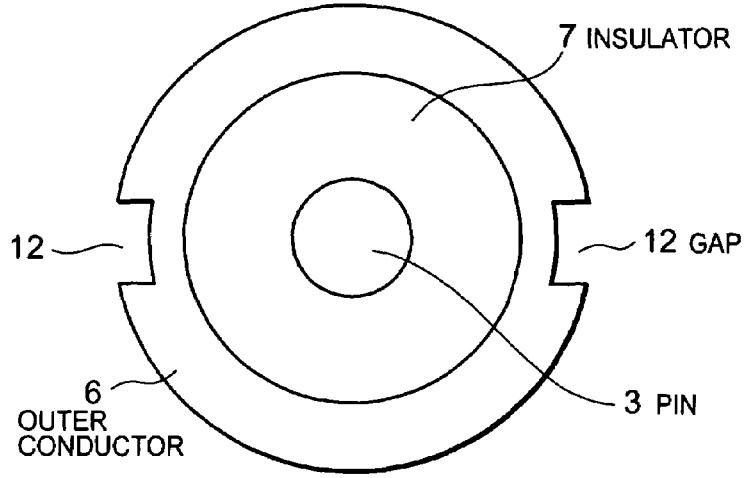
Figure 2C:
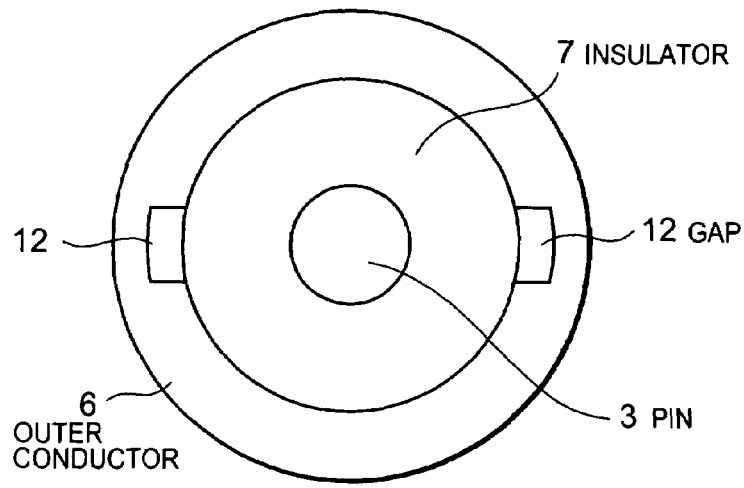

FIGS. 2A-2C are exemplary sectional views of circuit lead pins (e.g., LSI lead pins) according to the present exemplary embodiment. As shown in FIG. 2A, the circuit lead pin (e.g., the LSI lead pin) may include pin 3 that is a core wire for transmitting a signal in its center, insulator 7 coaxially provided outside pin 3, and outer conductor 6 that covers an outer periphery of insulator 7, and accordingly circuit lead pin 3 (e.g., LSI lead pin 3) may include the similar structure of a coaxial cable. In this FIG. 2A, outer conductor 6 includes gap 12 in at least part of an arc of the section for the outer periphery. For example, when the outer periphery of outer conductor 6 is 3 mm, two outer conductors 6 whose arc lengths are 1.2 mm respectively are combined, and gaps 12 between the arcs are 0.3 mm respectively. One or two gaps 12 may be provided.

Gap 12 may not pass completely through outer conductor 6. For example, as shown in FIG. 2B, a part of outer conductor 6 may be thinner than another part of outer conductor 6. As shown in FIG. 2C, gap 12 may be located between insulator 7 and outer conductor 6. In this case, air works as a type of insulator.

Figure 3A:
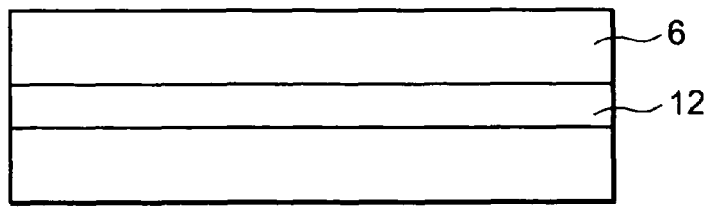
FIGS. 3A-3E show exemplary side views of exemplary outer conductors 6 according to an exemplary embodiment of the present invention.
Figure 3B:
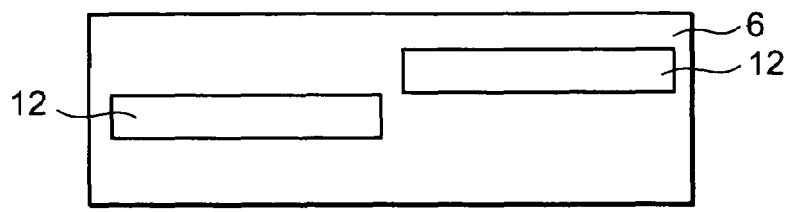
Figure 3C:
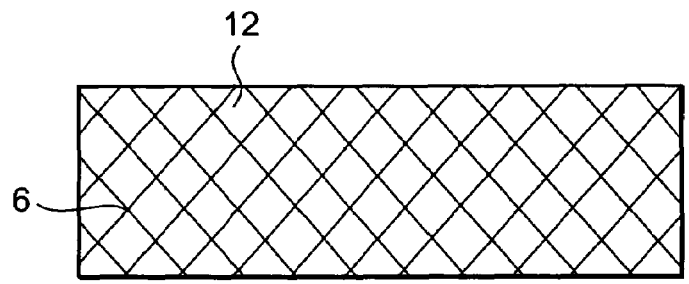

Gap 12 may have such a configuration that the position of the gap at an arc for the section of outer conductor 6 is extended at the same position along a longitudinal direction of pin 3 as shown in FIG. 3A, or that the gaps are disposed at the different positions along a longitudinal direction of pin 3. An end of gap 12 may be open as shown in FIG. 3A or be closed as shown in FIG. 3B. Or, such configuration may be allowed that outer conductor 6 includes the gaps in a mesh state on the conductor's side as shown in FIG. 3C.

Figure 3D:
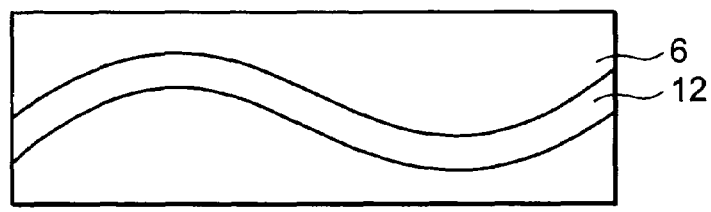
Figure 3E:
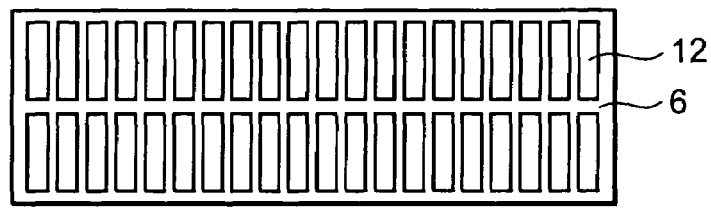

For example, as shown in FIG. 3D, gap 12 may be extended as a wavy line along a longitudinal direction of pin 3. As shown in FIG. 3E, a plurality of gaps 12 may be extended in a direction perpendicular to a longitudinal direction of pin 3. In this example, gaps in a mesh state are shown.

As is well known, characteristic impedance $Z_O$ of a coaxial cable is found by $Z_O=60 \, (1/\sqrt{er}) \ln(d2/d1)$. Where, er represents a relative permittivity of insulator 7, d2 represents a radius of outer conductor (shield) 6, and d1 represents a radius of central conductor (pin) 3.

In the present exemplary embodiment, modifying a type of insulator 7, the thickness of the insulator, the size of gap 12 for an arc, the number of gaps provided, and/or the shape of a gap, the impedance may be variably adjusted.

Thereby, the impedance of circuit lead pin 3 (e.g., LSI lead pin 3) may be matched with a characteristic impedance of the signal transmission line on a circuit (e.g., LSI package 1) or printed-circuit 2 or a semiconductor device that includes a circuit (e.g., LSI package 1) and a printed-circuit 2. For example, generally, a high-speed signal is designed so as to set a characteristic impedance to 50Ω. When signal lines 4 and 5 are designed to set their characteristic impedance to 50Ω and pin 3 is also designed to set its characteristic impedance to 50Ω, characteristic impedance does not become discontinuous, there is no influence of reflection due to discontinuous characteristic impedance, and signal transmission with little loss is thus enabled.

The present invention may be preferable when it is applied to an IC using a signal whose frequency exceeds 1 GHz, an IC that is incorporated into information processing equipment, communications equipment, video equipment to which an IC is connected and the like.

While this invention has been described with reference to exemplary embodiments, this description is not intended as limiting. Various modifications of the illustrative embodiments, as well as other embodiments of the invention, will be apparent to persons skilled in the art upon taking description as a whole. It is, therefore, contemplated that the appended claims will cover any such modifications or embodiments as fall within the true scope of the invention.

Further, the inventor's intent is to encompass all equivalents of all the elements of the claimed invention even if the claims are amended during prosecution.

This application is based on Japanese Patent Application No. 2005-303383 filed on Oct. 18, 2005 and including specification, claims, drawings and summary. The disclosure of the above Japanese Patent Application is incorporated herein by reference in its entirety.

What is claimed is:

1. A lead pin of a circuit, comprising:
   a pin;
   an insulator that surrounds said pin; and
   a conductor that surrounds said insulator,
   said conductor including non-uniformity and said conductor comprising a gap,
   wherein said gap is placed between said insulator and said conductor, and
   wherein said conductor comprises a thinner portion at a location where said gap is placed than another portion of said conductor.

2. The lead pin according to claim 1, wherein a thickness of said insulator is non-uniform.

3. The lead pin according to claim 1, wherein an end of said conductor is connectable to a ground potential.

4. The lead pin according to claim 1, wherein said lead pin is adjustable to substantially match impedances of a signal line of a circuit connectable to said lead pin and a signal line of a printed-circuit board, said circuit being mountable on said printed-circuit board.

5. A circuit, comprising:
said lead pin according to claim 1.

6. A semiconductor device, comprising:
said circuit according to claim 5; and
a printed-circuit board, said circuit being connectable to said printed-circuit board through said lead pin.

7. A lead pin of a circuit, comprising:
a pin;
an insulator that surrounds said pin; and
a conductor that surrounds said insulator,
said conductor including non-uniformity and said conductor comprising a gap,
wherein said gap is placed in an arc of said conductor along a longitudinal direction of said conductor, being extended at a same location of said arc, and
wherein said conductor comprises a thinner portion at a location where said gap is placed than another portion of said conductor.

8. A lead pin of a circuit, comprising:
a pin;
an insulator that surrounds said pin; and
a conductor that surrounds said insulator,
said conductor including non-uniformity and said conductor comprising a gap,
said conductor comprising a plurality of gaps that are placed along a longitudinal direction of said conductor at different locations of arcs, and
wherein said conductor comprises a thinner portion at a location where said gap is placed than another portion of said conductor.

9. A lead pin of a circuit, comprising:
a pin;
an insulator that surrounds said pin; and
a conductor that surrounds said insulator,
said conductor including non-uniformity and said conductor comprising a gap,
wherein said conductor includes said gap in a mesh state, and
wherein said conductor comprises a thinner portion at a location where said gap is placed than another portion of said conductor.

10. A lead pin of a circuit, comprising:
a pin;
an insulator that surrounds said pin; and
a conductor that surrounds said insulator,
said conductor including non-uniformity and said conductor comprising a gap,
wherein said gap is placed in an arc of said conductor along a longitudinal direction of said conductor, being extended as a wavy line, and
wherein said conductor comprises a thinner portion at a location where said gap is placed than another portion of said conductor.

11. A lead pin of a circuit, comprising:
a pin;
an insulator that surrounds said pin; and
a conductor that surrounds said insulator,
said conductor including non-uniformity and said conductor comprising a gap,
wherein a plurality of said gaps are extended in a direction perpendicular to a longitudinal direction of said pin, and
wherein said conductor comprises a thinner portion at a location where said gap is placed than another portion of said conductor.

12. A method of forming a lead pin, comprising:
surrounding a pin with an insulator;
surrounding said insulator with a conductor that includes non-uniformity;
providing a gap in said conductor;
placing said gap between said insulator and said conductor; and making said conductor thinner at a location of said gap than another portion of said conductor.

13. The method according to claim 12, further comprising:
placing said gap in an arc of said conductor, said gap being extended in a direction perpendicular to a longitudinal direction of said pin.

14. The method according to claim 12, further comprising:
adjusting a thickness of said insulator.

15. The method according to claim 12, further comprising:
connecting an end of said conductor to a ground potential.

16. The method according to claim 12, further comprising:
adjusting said lead pin for matching of impedances of a signal line of a circuit connectable to said lead pin and a signal line of a printed-circuit board, said circuit being mountable on said printed-circuit board.

17. A method of forming a lead pin, comprising:
surrounding a pin with an insulator;
surrounding said insulator with a conductor that includes non-uniformity;
providing a gap in said conductor;
placing said gap in an arc of said conductor along a longitudinal direction of said conductor, said gap being extended at a same location of said arc; and
making said conductor thinner at a location of said gap than another portion of said conductor.

18. A method of forming a lead pin, comprising:
surrounding a pin with an insulator;
surrounding said insulator with a conductor that includes non-uniformity;
providing a gap in said conductor;
placing a plurality of gaps along a longitudinal direction of said conductor at different locations of arcs; and
making said conductor thinner at a location of said gap than another portion of said conductor.

19. A method of forming a lead pin, comprising:
surrounding a pin with an insulator; and
surrounding said insulator with a conductor that includes non-uniformity;
providing a gap in said conductor;
providing said gap in a mesh state; and
making said conductor thinner at a location of said gap than another portion of said conductor.

20. A method of forming a lead pin, comprising:
surrounding a pin with an insulator; and
surrounding said insulator with a conductor that includes non-uniformity;
providing a gap in said conductor;
placing said gap in an arc of said conductor along a longitudinal direction of said conductor, being extended as a wavy line; and
making said conductor thinner at a location of said gap than another portion of said conductor.

* * * * *

UNITED STATES PATENT AND TRADEMARK OFFICE
CERTIFICATE OF CORRECTION

PATENT NO.         : 7,602,059 B2
APPLICATION NO. : 11/485393
DATED              : October 13, 2009
INVENTOR(S)        : Yasushi Nobutaka and Hiroshi Kamiya It is certified that error appears in the above-identified patent and that said Letters Patent is hereby corrected as shown below:

Title Page, item (73) should read as follows: Assignee: NEC System Technologies, Ltd.

Signed and Sealed this

First Day of December, 2009

David J. Kappos
*Director of the United States Patent and Trademark Office*